United States Patent [19]

Aiba

[11] Patent Number: 4,641,219
[45] Date of Patent: Feb. 3, 1987

[54] LOW NOISE SOLENOID DRIVE
[75] Inventor: Masahiko Aiba, Nara, Japan
[73] Assignee: Sharp Kabushiki Kaisha, Osaka, Japan
[21] Appl. No.: 628,714
[22] Filed: Jul. 9, 1984
[30] Foreign Application Priority Data
  Jul. 12, 1983 [JP] Japan .................. 58-127393
[51] Int. Cl.⁴ .................................. H01H 47/32
[52] U.S. Cl. .............................. 361/153; 361/154
[58] Field of Search ............. 361/152, 153, 156, 160, 361/154

[56] References Cited
U.S. PATENT DOCUMENTS
4,473,861  9/1984  Kosak et al. ................... 361/152
4,485,425 11/1984  Grüner et al. ................. 361/152
4,516,185  5/1985  Culligan et al. ............... 361/154
4,567,975  2/1986  Roll ............................. 361/154

Primary Examiner—Michael L. Gellner
Assistant Examiner—David M. Gray
Attorney, Agent, or Firm—Birch, Stewart, Kolasch & Birch

[57] ABSTRACT

A solenoid drive system includes a driver circuit which functions to gradually increase current flowing through a solenoid coil. The attracting force created by the solenoid is proportional to the current flowing through the solenoid coil. When the attracting force becomes greater than a load including the plunger, the plunger moves toward the operating end. At a time when the plunger reaches the operating end, the current is still in the increasing curve and, therefore, an excess force is minimized. This functions to minimize noises created by the plunger movement.

3 Claims, 14 Drawing Figures

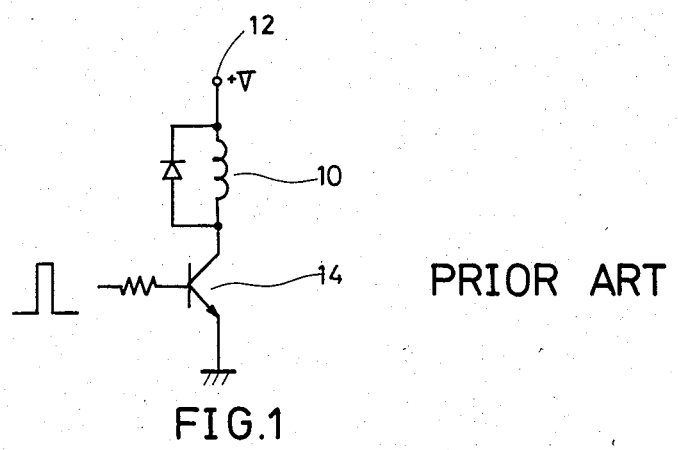
FIG.1  PRIOR ART
FIG.2 (A)  PRIOR ART
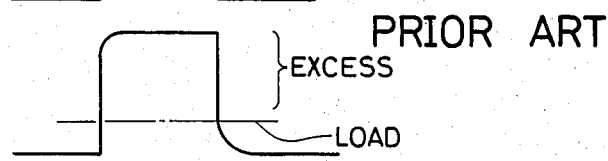
FIG.2 (B)  PRIOR ART
FIG.2 (C)  PRIOR ART
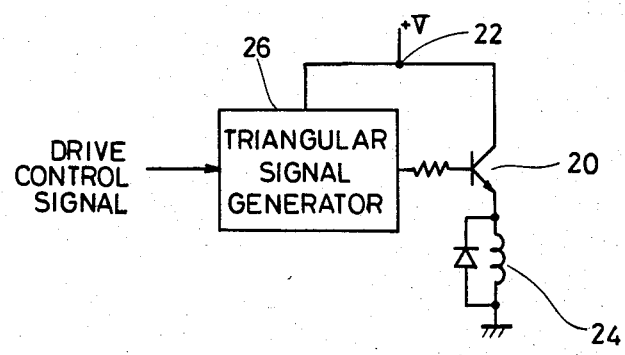
FIG.3

FIG. 4 (A)
FIG. 4 (B) }EXCESS LOAD
FIG. 4 (C) C
FIG. 4 (D)
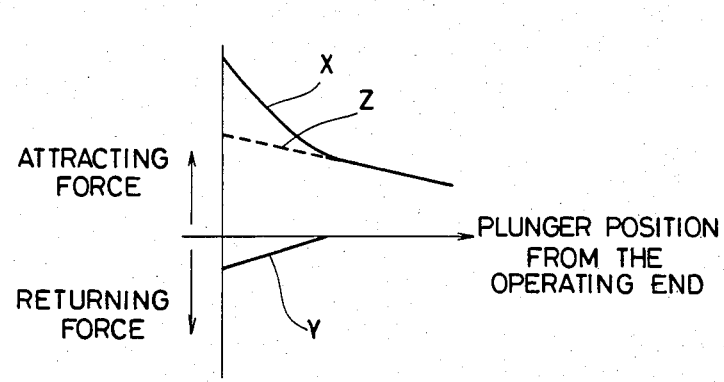
FIG. 7
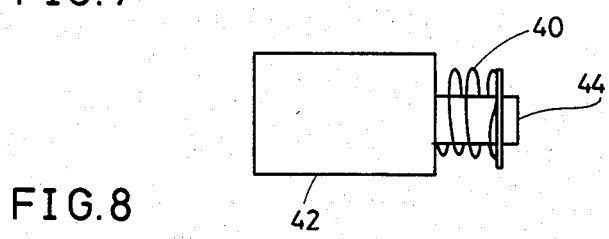
FIG. 8

LOW NOISE SOLENOID DRIVE

BACKGROUND OF THE INVENTION

1. Field of the Invention

The present invention relates to a solenoid drive system in, for example, a printer and, more particularly, to a solenoid drive system which ensures a low noise operation.

2. Description of the Prior Art

Generally, a load is mechanically connected to a plunger of a solenoid system, the load being subject to variation. The attracting force created in the solenoid system is usually adjusted to the value suited for the maximum load in order to ensure a stable operation even when the load varies. If the load is considerably small, a large amount of excess force is created in the solenoid system. In the conventional system, since a rectangular drive signal is applied to the driver circuit, the excess force produces high noises. This is because the attracting force of the maximum value is applied to the plunger without regard to the load connected to the plunger.

OBJECTS AND SUMMARY OF THE INVENTION

Accordingly, an object of the present invention is to provide a solenoid drive system which ensures low noise operation.

Another object of the present invention is to provide a solenoid driver circuit which ensures a smooth movement of a plunger without regard to a load connected to the plunger.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a triangular drive signal is applied to a solenoid driver so that the solenoid current gradually increases causing the attracting force created in the solenoid system to gradually increase. When the attracting force becomes higher than the load value, the plunger begins to move. The attracting force has not yet reached its maximum value when the plunger has reached the operating end. That is, the excess force is not very high at a time when the plunger reaches the operating end. This functions to minimize the noises which are created when the plunger is stopped at the operating end.

In another embodiment, a pulse train of which the duty gradually varies, is applied to a solenoid driver circuit so that the attracting force gradually increases. In this embodiment, the driver circuit is digitalized.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 1 is a circuit diagram of a conventional solenoid driver circuit;

FIGS. 2(A), 2(B) and 2(C) are waveform charts for explaining an operational mode of the solenoid driver circuit of FIG. 1;

FIG. 3 is a circuit diagram of an embodiment of a solenoid drive system of the present invention;

FIGS. 4(A), 4(B), 4(C) and 4(D) are waveform charts for explaining an operational mode of the solenoid drive system of FIG. 3;

FIG. 7 is a graph for explaining the attracting operation in the solenoid system; and FIG. 8 is a schematic plan view of an embodiment of a solenoid mechanism of the present invention.

DESCRIPTION OF THE PREFERRED EMBODIMENTS

Figure 5:
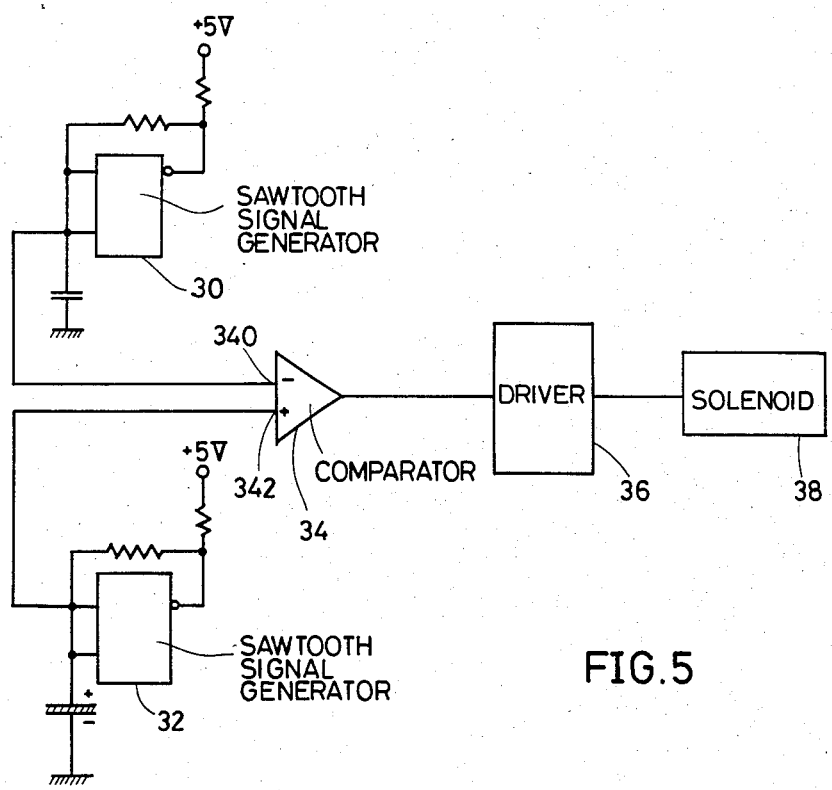
FIG. 5 is a circuit diagram of another embodiment of a solenoid drive system of the present invention.

A conventional solenoid driver circuit will be first described with reference to FIG. 1. One end of a solenoid coil 10 is connected to a D.C. voltage source 12 (+V), and the other end of the solenoid coil 10 is connected to a switching transistor 14. A solenoid drive rectangular signal is applied to the base of the switching transistor 14.

When the solenoid drive rectangular pulse signal is applied to the base of the switching transistor 14, a voltage as shown in FIG. 2(A) is applied to the solenoid coil 10 in response to the switching operation of the switching transistor 14. A current as shown in FIG. 2(B) flows through the solenoid coil 10. The current shown in FIG. 2(B) corresponds to the attracting force created by the solenoid mechanism. When the attracting force becomes greater than a load level LOAD, the plunger moves toward the operating end, and the plunger is held at the operating end (point C) as shown in FIG. 2(C). The plunger movement is rapid because an excess force EXCESS is large at the time when the plunger reaches the operating end. This will create noises. When the solenoid current disappears, the plunger returns to its normal position by means of the return spring connected to the plunger.

In order to ensure stable attracting operation, the attracting force is set at a value suited for the maximum load. Therefore, if the load is small, the excess force EXCESS is considerably large and produces large noises.

FIG. 3 shows an embodiment of a solenoid drive system of the present invention. A collector of a transistor 20 is connected to a D.C. voltage source 22 (+V) which determines the maximum attracting force created by the solenoid. An emitter of the transistor 20 is connected to one end of a solenoid coil 24. The other end of the solenoid coil 24 is grounded. A base of the transistor 20 is connected to a triangular signal generator 26 which responds to a drive control signal applied thereto.

When the triangular signal is applied from the triangular signal generator 26 to the base of the transistor 20, a voltage as shown in FIG. 4(A) is applied to the solenoid coil 24. A current as shown in FIG. 4(B) flows through the solenoid coil 24. As already discussed, the current shown in FIG. 4(B) corresponds to the attracting force created in the solenoid mechanism. When the attracting force becomes greater than a load level LOAD, the plunger moves toward the operating end, and the plunger is held at the operating end (point C) as shown in FIG. 4(C). When the plunger reaches the operating end (point C), the attracting force has not yet reached its maximum value. The excess force EXCESS is small when the plunger contacts the operating end and, therefore, noises are minimized. When a large load is connected to the plunger, the plunger movement is conducted in a manner shown in FIG. 4(D). In both cases of FIGS. 4(C) and 4(D), the plunger movement is initiated at a point on the increasing slope of the solenoid current, and the plunger movement is stopped at another point on the increasing slope of the solenoid current. Thus, the excess force is minimized at the time when the plunger reaches the operating end. This functions to minimize the noises.

Figure 6A:
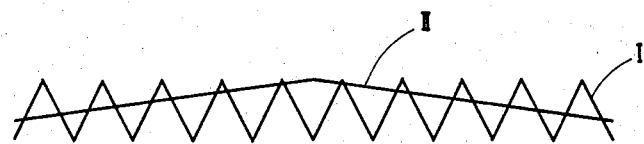
FIGS. 6(A) and 6(B) are waveform charts showing various signals occurring within the solenoid drive system of FIG. 5.
Figure 6B:

FIG. 5 shows another embodiment of the solenoid drive system of the present invention. A first sawtooth signal generator 30, preferably an oscillator NE556 manufactured by Texas Instruments Incorporated, develops a sawtooth signal I shown in FIG. 6(A). A second sawtooth signal generator 32, preferably an oscillator NE556 manufactured by Texas Instruments Incorporated, develops a sawtooth signal II shown in FIG. 6(A). The sawtooth signal I is applied to a negative input terminal 340 of a comparator 34, and the sawtooth signal II is applied to a positive input terminal 342 of the comparator 34. The comparator 34 is preferably a comparator LM339 manufactured by Texas Instruments Incorporated, and develops an output signal as shown in FIG. 6(B). The output signal of the comparator 34 is applied to a solenoid driver 36, preferably a driver M545 manufactured by Texas Instruments Incorporated. The driver 36 intermittently supplies a current to a solenoid coil 38 so that the attracting force gradually increases in response to the pulse width of the output signal of the comparator 34. The load level is selected to take a point in the increasing slope of the attracting force.

Generally, the attracting force created by the solenoid mechanism becomes large as the plunger moves closer to the operating end as shown by the curve X in FIG. 7 even when the solenoid current is fixed at a predetermined value. This means that the excess force becomes large as the plunger becomes nearer to the operating end. This will increase the noises. If the returning spring connected to the plunger has a spring force as shown by the curve Y, the attracting force will become as shown by the dotted line Z in FIG. 7. The thus modified attracting force will minimize noise.

FIG. 8 shows a solenoid mechanism of the present invention, which includes a returning spring 40 disposed between a solenoid 42 and a plunger 44. The returning spring 40 has a returning force characteristic shown by the curve Y of FIG. 7. The returning spring 40 functions to minimize the excess force when the plunger reaches the operating end.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A solenoid drive system comprising:
a solenoid coil;
transistor means connected to one end of said solenoid coil;
a driver circuit which controls the operation of said transistor means,
said driver circuit including a triangular signal generator connected to said transistor means for applying a triangular drive signal to an input of said transistor means;
plunger means activated by a force developed in said solenoid coil, said force being directly proportional to said triangular drive signal;
a load connected to one end of said plunger means, wherein said plunger means moves said load from an initial position to an operating position upon activation by the force developed in said solenoid coil,
said initial position corresponding to one point on an increasing slope of said triangular drive signal and said operating position corresponding to another point on said increasing slope,
such that the distance between said one point and said another point, corresponds to the excess force on said load at said operating position, and is minimized.

2. A solenoid drive system comprising:
a solenoid coil;
plunger means activated by said solenoid coil when the latter is energized;
a load connected to one end of said plunger means, said load being moved from an initial position to an operating position by said activated plunger means;
control means for controlling the energization of said solenoid coil, including
  a first sawtooth signal generator having a sawtooth output signal of a first frequency,
  a second sawtooth signal generator having a sawtooth output signal of a second frequency,
  a comparator for comparing the levels of said sawtooth signals from said first and second sawtooth signal generators, and developing a pulse train wherein the pulse width varies in accordance with the result of the comparison; and
solenoid driver means for activating said solenoid coil in response to the pulse train developed by said comparator,
to thereby gradually increase the attracting force of said solenoid coil such that said load reaches said operating position with a minimum of excess attracting force.

3. A solenoid drive system comprising:
a solenoid coil;
plunger means activated by an attracting force of said solenoid coil when the latter is energized;
a load connected to one end of said plunger means, said load being moved in a single actuation thereof from an initial position to an operating position when said plunger means is activated;
control means for controlling the energization of said solenoid coil, said control means producing a train of pulses of varying width, to thereby gradually increase the attracting force of said solenoid coil for said single actuation,
such that said load arrives at said operating position with a minimum of excess attracting force.

* * * * *